US012553133B2

(12) United States Patent
Chowdhury et al.

(10) Patent No.: US 12,553,133 B2
(45) Date of Patent: Feb. 17, 2026

(54) SUBSTRATE HANDLING SYSTEM, METHOD, AND APPARATUS

(71) Applicant: Applied Materials, Inc., Santa Clara, CA (US)

(72) Inventors: Abhishek Chowdhury, Bangalore (IN); Nataraj Bhaskar Rao, Bangalore (IN); Edwin C. Suarez, Pleasanton, CA (US); Harisha Sathyanarayana, Bangalore (IN); Diego Ramiro Puente Sotomayor, Phoenix, AZ (US); Qanit Takmeel, Mesa, AZ (US); Mohammad Kamruzzaman Chowdhury, Phoenix, AZ (US); Arun Chakravarthy Chakravarthy, Tamil Nadu (IN)

(73) Assignee: Applied Materials Inc., Santa Clara, CA (US)

( * ) Notice: Subject to any disclaimer, the term of this patent is extended or adjusted under 35 U.S.C. 154(b) by 694 days.

(21) Appl. No.: 17/881,428

(22) Filed: Aug. 4, 2022

(65) Prior Publication Data

US 2024/0044002 A1 Feb. 8, 2024

(51) Int. Cl.
*C23C 16/458* (2006.01)

(52) U.S. Cl.
CPC ...... *C23C 16/4581* (2013.01); *C23C 16/4585* (2013.01)

(58) Field of Classification Search
None
See application file for complete search history.

(56) References Cited

U.S. PATENT DOCUMENTS 4,407,654 A 10/1983 Irwin
5,310,339 A 5/1994 Ushikawa
(Continued)

FOREIGN PATENT DOCUMENTS

JP D1747763 6/2023
JP D1747764 6/2023
(Continued)

OTHER PUBLICATIONS

International Search Report for PCT/US2023/027370, dated Oct. 30, 2023.

(Continued)

*Primary Examiner* — Jeffrie R Lund
*Assistant Examiner* — Tiffany Z Nuckols
(74) *Attorney, Agent, or Firm* — Moser Taboada

(57) ABSTRACT

A substrate handling system includes a fixed deposition ring having a plurality of circumferentially spaced notches along an outer edge of the fixed deposition ring, the fixed deposition ring being electrically non-conductive; a moving deposition ring having a plurality of circumferentially spaced recesses formed on a lower surface of the moving deposition ring, the recesses configured to radially align with the notches of the fixed deposition ring, the moving deposition ring having an inner edge and an outer edge, the moving deposition ring being electrically non-conductive; and a plurality of electrically conductive grounding plates each having a base, an intermediate member, and a contact extending from the intermediate member and being spaced from the base, the intermediate members configured to be received in the recesses and extend between the inner edge and the outer edge of the moving deposition ring.

16 Claims, 10 Drawing Sheets

(56) References Cited

U.S. PATENT DOCUMENTS

| | | | |
|---|---|---|---|
| 6,123,804 | A | 9/2000 | Babassi et al. |
| 6,231,038 | B1 | 5/2001 | Keyser et al. |
| 6,287,435 | B1 | 9/2001 | Drewery et al. |
| 6,980,005 | B2 | 12/2005 | Finlay, Sr. et al. |
| D655,255 | S | 3/2012 | Takebayashi et al. |
| 8,485,128 | B2 | 7/2013 | Kellogg et al. |
| D711,331 | S | 8/2014 | Lau et al. |
| D716,239 | S | 10/2014 | Lau et al. |
| D717,746 | S | 11/2014 | Lau et al. |
| 9,818,585 | B2 | 11/2017 | Green et al. |
| D812,014 | S | 3/2018 | Katagiyama et al. |
| D888,903 | S | 6/2020 | Gunther et al. |
| D925,481 | S | 7/2021 | Kagaya et al. |
| D933,725 | S | 10/2021 | Koppa et al. |
| D933,726 | S | 10/2021 | Savandalah et al. |
| D934,315 | S | 10/2021 | Lavitsky et al. |
| D939,459 | S | 12/2021 | Shimada et al. |
| 11,798,823 | B2 | 10/2023 | Miyake et al. |
| D1,005,245 | S | 11/2023 | Nakatani et al. |
| D1,034,493 | S | 7/2024 | Kwon et al. |
| D1,040,304 | S | 8/2024 | Gunther et al. |
| 2005/0150452 | A1 | 7/2005 | Sen et al. |
| 2009/0050272 | A1 | 2/2009 | Rosenberg et al. |
| 2012/0003836 | A1* | 1/2012 | Kellogg ............ H01L 21/68785 118/723 R |
| 2012/0042825 | A1 | 2/2012 | Hawrylchak |
| 2012/0103257 | A1 | 5/2012 | Rasheed et al. |
| 2012/0240853 | A1 | 9/2012 | Carlson et al. |
| 2013/0055952 | A1 | 3/2013 | Subramani et al. |
| 2013/0206070 | A1 | 8/2013 | Chen |
| 2014/0262763 | A1 | 9/2014 | Rasheed et al. |
| 2015/0181684 | A1* | 6/2015 | Banna ............... H01J 37/32697 315/111.21 |
| 2016/0322250 | A1 | 11/2016 | Male et al. |
| 2017/0002461 | A1 | 1/2017 | Johanson et al. |
| 2018/0264621 | A1 | 9/2018 | Yoo |
| 2019/0259635 | A1 | 8/2019 | Parathithasan et al. |
| 2019/0259647 | A1 | 8/2019 | Thirunavukarasu et al. |
| 2020/0027705 | A1* | 1/2020 | Kim .................. H01J 37/32715 |
| 2020/0090915 | A1 | 3/2020 | Kerschbaumer et al. |
| 2020/0194243 | A1 | 6/2020 | Gunther et al. |
| 2020/0234928 | A1 | 7/2020 | Vishwanath |
| 2021/0175107 | A1* | 6/2021 | Savandaiah ......... H01L 21/6831 |
| 2022/0157572 | A1 | 5/2022 | Chowdhury et al. |
| 2022/0165551 | A1 | 5/2022 | Pei et al. |
| 2022/0344134 | A1 | 10/2022 | Mustafa et al. |
| 2022/0406573 | A1 | 12/2022 | Gunther et al. |
| 2024/0044002 | A1 | 2/2024 | Chowdhury et al. |

FOREIGN PATENT DOCUMENTS

| | | | |
|---|---|---|---|
| KR | 10-2009-0064113 | A | 6/2009 |
| TW | D211225 | S | 5/2021 |
| TW | D217060 | S | 2/2022 |

OTHER PUBLICATIONS 0020-10059 _ Ring Wafer Lift RP 0020-09844—0020-09183 _ Applied Materials Amat _ eBay, posted Aug. 22, 2022. [retrieved Nov. 21, 2024]. Retrieved from internet: https://www.ebay.com/itm/295132073147 (Year: 2022).

0020-30483 _ Clamp Ring XTAL Notch EXT 8 QER _ Applied Materials Amat _eBay. posted Jan. 17, 2024, [retrieved Nov. 21, 2024], Retrieved from internet: https://www.ebay.com/itm/295561026577 (Year: 2024).

0020-27744 _ Clamp Ring,8 SST,Clamp Degas @ E. 6 Pad _ Applied Materials Amat _ eBay, posted Jan. 6, 2023. [retrieved Nov. 21, 2024]. Retrieved from internet: https://www.ebay.com/itm/304970564439 (Year: 2023).

0021-15555 _Deposition Ring,8 SNNF, ESC, ALUM, High _Applied Materials Amat _ eBay, posted Jan. 18, 2024, [retrieved Nov. 21, 2024]. Retrieved from internet: https://www.ebay.com.sg/itm/295417158877 (Year: 2024).

* cited by examiner

SUBSTRATE HANDLING SYSTEM, METHOD, AND APPARATUS

FIELD

Embodiments of the present disclosure generally relate to substrate handling, and more specifically to systems, methods, and apparatus for handling and grounding substrates.

BACKGROUND

Substrate processing equipment generally includes process chambers configured to perform certain processes on a substrate, for example, chemical vapor deposition (CVD), atomic layer deposition (ALD), etching, or the like. Substrate handling mechanisms inside process chambers use insulated rings for substrate transfer. Such substrate handling mechanisms do not provide for a way to ground and dechuck the substrate.

Accordingly, the inventors have provided embodiments of improved substrate handling systems, methods, and apparatus as disclosed herein.

SUMMARY

Systems, methods, and apparatus for handling substrates are provided herein. In some embodiments, a substrate handling system includes a substrate support having a substrate support surface configured to support a substrate; a fixed deposition ring seated on the substrate support around the substrate support surface; a moving deposition ring disposed above the fixed deposition ring and configured for vertical movement relative to the fixed deposition ring; a plurality of circumferentially spaced, electrically conductive grounding plates vertically disposed between the fixed deposition ring and the moving deposition ring, each grounding plate extending from a radially inner end to a radially outer end, each grounding plate configured for vertical movement relative to the fixed deposition ring, and each grounding plate having an electrical contact at the radially inner end; and a plurality of circumferentially spaced, electrically conductive lift pins arranged around the substrate support and under the radially outer ends of the grounding plates, the lift pins configured for vertical movement relative to the substrate support, wherein the substrate handling system is configurable between a first configuration wherein the lift pins are spaced vertically from the radially outer ends of the grounding plates and a second configuration wherein the lift pins are in contact with the radially outer ends of the grounding plates, wherein in the second configuration an electrically conductive path is formed through the grounding plates and the lift pins.

In some embodiments, a grounding member for grounding a substrate includes a grounding plate comprising: a base configured to seat on a lift pin; an intermediate member extending horizontally from the base to a second end spaced from the base; and a contact extending vertically from the intermediate member to a location above the base, wherein the grounding plate is electrically conductive.

In some embodiments, a substrate handling system includes a fixed deposition ring having a plurality of circumferentially spaced notches along an outer edge of the fixed deposition ring, the fixed deposition ring being electrically non-conductive; a moving deposition ring having an inner edge and a plurality of circumferentially spaced notches formed along the inner edge of the moving deposition ring, the notches configured to radially align with the notches of the fixed deposition ring, the moving deposition ring being electrically non-conductive; and a plurality of electrically conductive grounding plates each having a base, an intermediate member, and a contact extending from the intermediate member and being spaced from the base, each contact configured to be received in a corresponding notch formed in the inner edge of the moving deposition ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
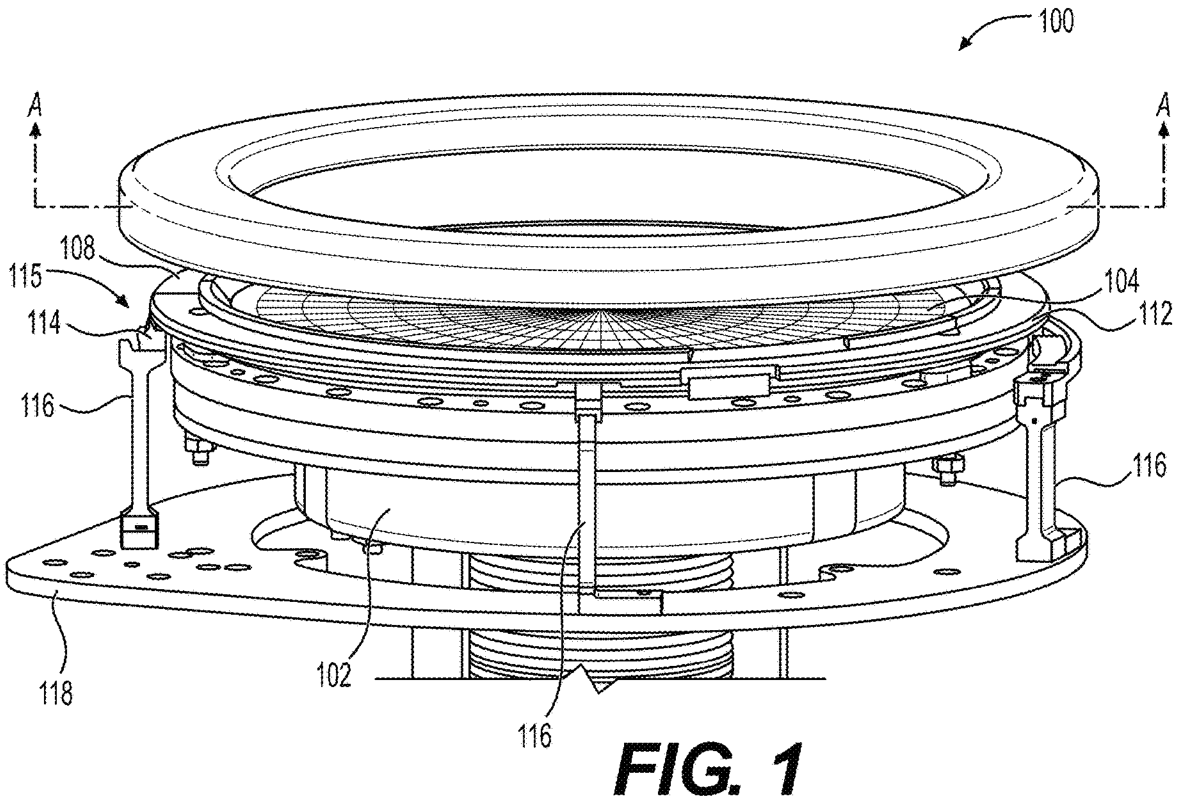
FIG. 1 is an isometric view of a substrate handling system in accordance with at least one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate handling system, apparatus, and method are provided herein to facilitate and grounding of substrates that are handled along outer edges of the substrates. The substrate handling system is configured to discharge residual electrical charge on a substrate when the substrate is transferred on and off a substrate support, such as an electrostatic chuck.

Figure 2:
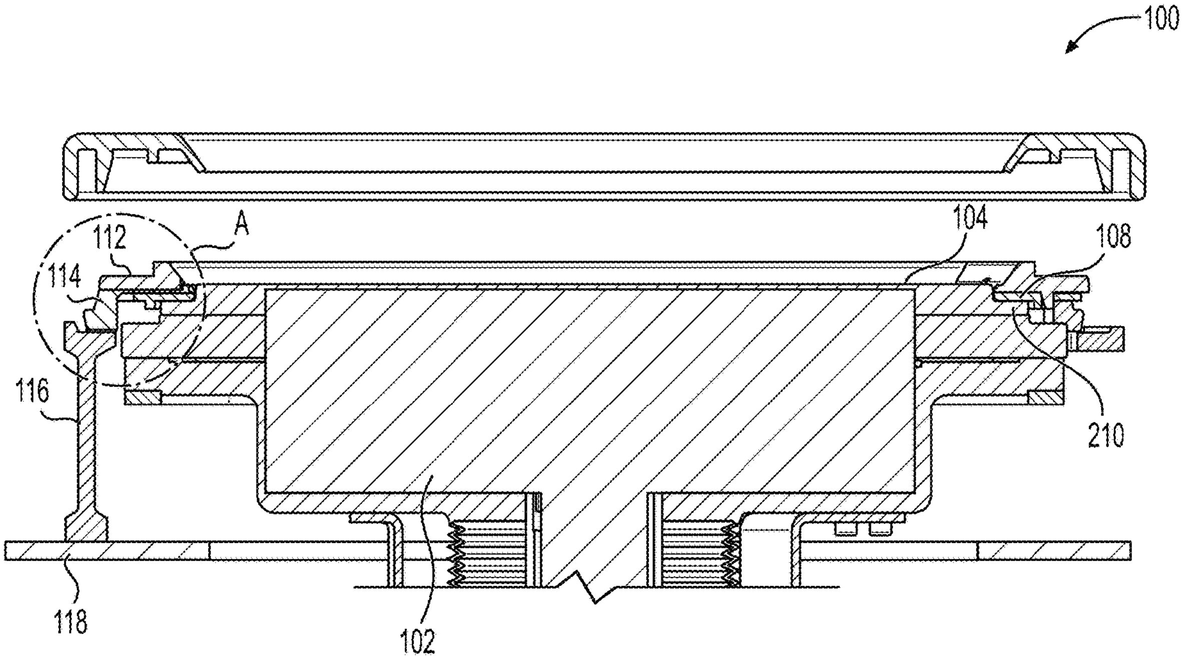
FIG. 2 is a section view of the substrate handling system of FIG. 1 along section A-A in FIG. 1.
Figure 6:
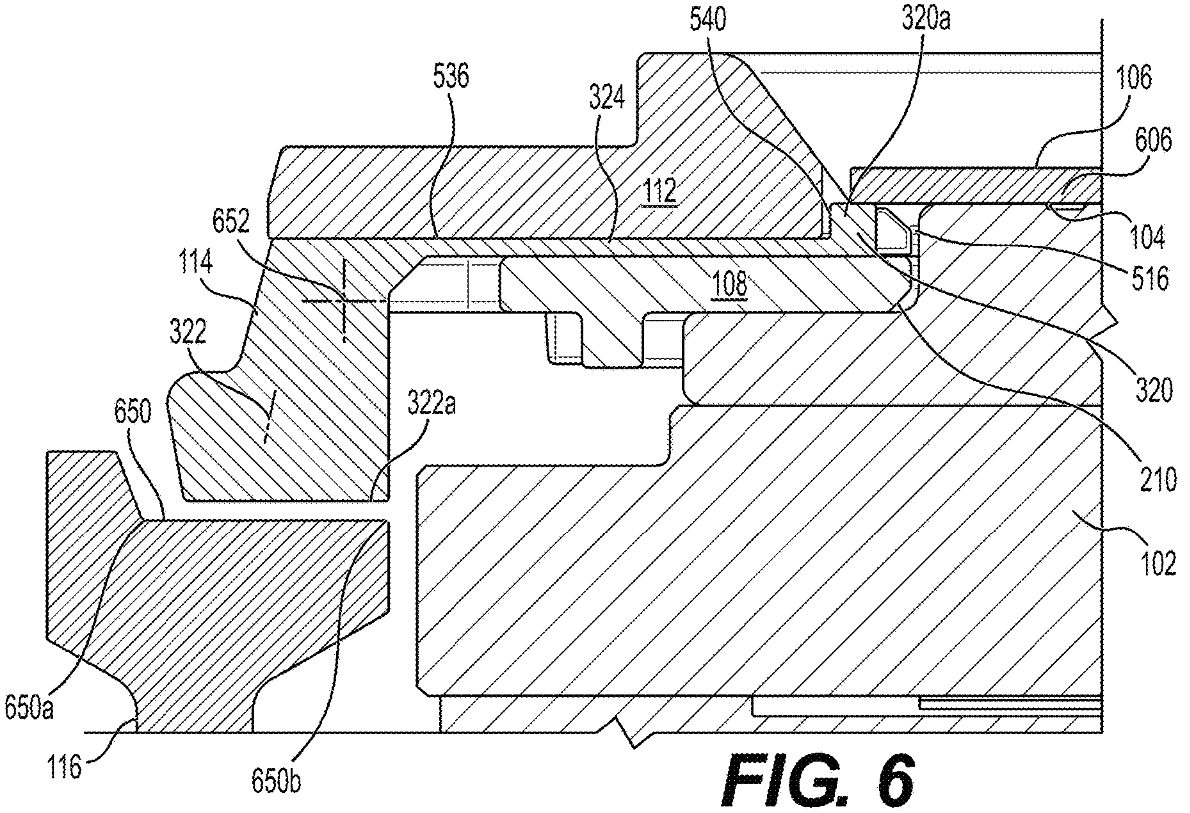
FIG. 6 is an enlarged section view of the portion labeled “A” in FIG. 2.

FIG. 1 is an isometric view of a substrate handling system 100 in accordance with at least one embodiment of the present disclosure. FIG. 2 is a section view of the substrate handling system 100 of FIG. 1 along section A-A in FIG. 1. In some embodiments, the substrate handling system 100 includes a substrate support 102 having a substrate support surface 104 configured for supporting a substrate 106 (FIG. 6). In some embodiments, the substrate support surface 104 may be part of an electrostatic chuck. In some embodiments, the substrate support surface 104 may have an area that is slightly smaller than an area of the substrate 106 so that an outer edge of the substrate 106 overhangs an outer edge of the substrate support surface 104, as is shown, for example, in FIG. 6.

In some embodiments, and as shown in FIG. 2, the substrate handling system 100 may include a fixed deposition ring 108 seated on the substrate support 102. The fixed deposition ring 108 may be seated on an annular surface 210 of the substrate support 102 adjacent the substrate support surface 104. In some embodiments, the fixed deposition ring 108 may be electrically non-conductive. For example, in some embodiments, the fixed deposition ring 108 may be made from ceramic.

In some embodiments, and as shown in FIG. 2, the substrate handling system 100 may include a moving deposition ring 112 configured to be disposed over the fixed deposition ring 108 and movable vertically relative to the fixed deposition ring. In some embodiments, the moving deposition ring 112 may be electrically non-conductive. For example, in some embodiments, the moving deposition ring 112 may be made from ceramic.

In some embodiments, and as shown in FIG. 1, the substrate handling system 100 may include one or more grounding elements 115. In some embodiments, the grounding elements 115 include a plurality of circumferentially spaced grounding plates 114, each grounding plate 114 having a portion disposed between the fixed deposition ring 108 and the moving deposition ring 112. As discussed in greater detail below, in some embodiments, each grounding plate 114 may include a contact 320 (FIG. 3) that is configured to extend adjacent to and contact an underside of the substrate 106 supported on the substrate support surface 104. In some embodiments, the grounding plates 114 may be electrically conductive. For example, in some embodiments, the grounding plates may be made wholly or partially from metal, such as aluminum.

In some embodiments, and as shown in FIGS. 1 and 2, the substrate handling system 100 may include a plurality of lift pins 116 that are circumferentially spaced from one another and around the substrate support 102 and located under the grounding plates 114 to operatively support the grounding plates 114 in at least one configuration of the substrate handling system 100. In some embodiments, the lift pins 116 may be electrically conductive so that an electrically conductive path may be formed between the grounding plates 114 and the lift pins 116. In some embodiments, the lift pins 116 may be made wholly or partially of metal, such as aluminum. Thus, in a configuration of the substrate handling system 100 wherein the contacts 320 of the grounding plates 114 engage the substrate 106 and the lift pins 116 engage the grounding plates 114, an electrical charge on the substrate 106 can be discharged through the grounding plates 114 and the lift pins 116.

In some embodiments, the substrate handling system 100 may be configured to ground a substrate 106 while handling the substrate 106. For example, as shown in FIGS. 1 and 2, the substrate handling system 100 may be configured in a first configuration in which the lift pins 116 and the substrate support 102 are relatively positioned in a first position, which may be referred to as a "home position", where the lift pins 116 are not in contact with the grounding plates 114. In the first configuration, the grounding plates 114, the moving deposition ring 112, and the fixed deposition ring 108 may be supported only by the substrate support 102. As discussed in greater detail below, the lift pins 116 may be raised together by raising a hoop or ring 118 connected to a lower end of the lift pins 116 so that the lift pins 116 may contact the grounding plates 114 to reconfigure the substrate handling system 100 into a second configuration. Raising the lift pins 116 further upward relative to the substrate support 102 can lift the grounding plates 114, the moving deposition ring 112, as well as the substrate 106 (if present on the substrate support surface 104) away from the fixed deposition ring 108.

Figure 3:
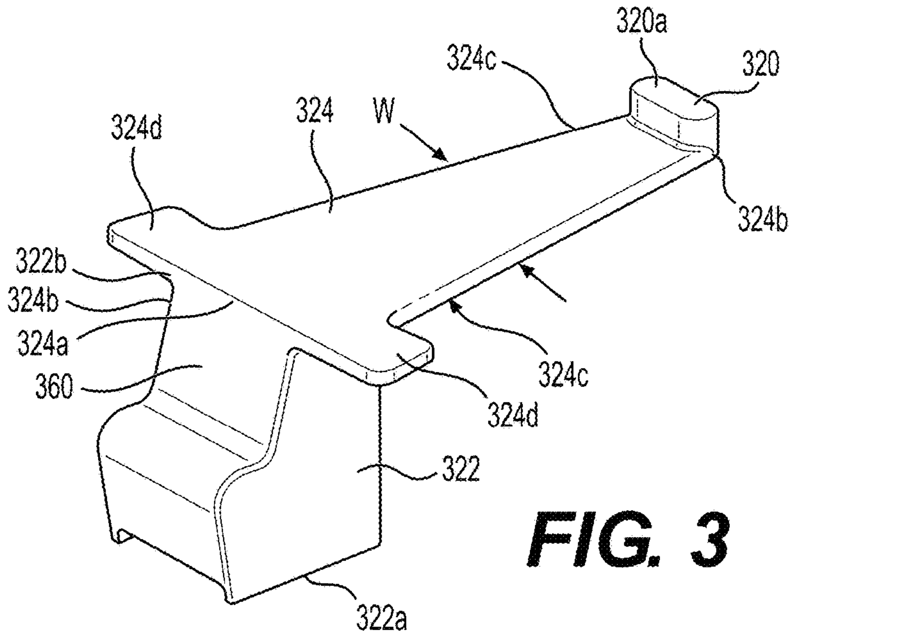
FIG. 3 is an isometric view of a grounding plate of a substrate handling system in accordance with at least one embodiment of the present disclosure.
Figure 8:
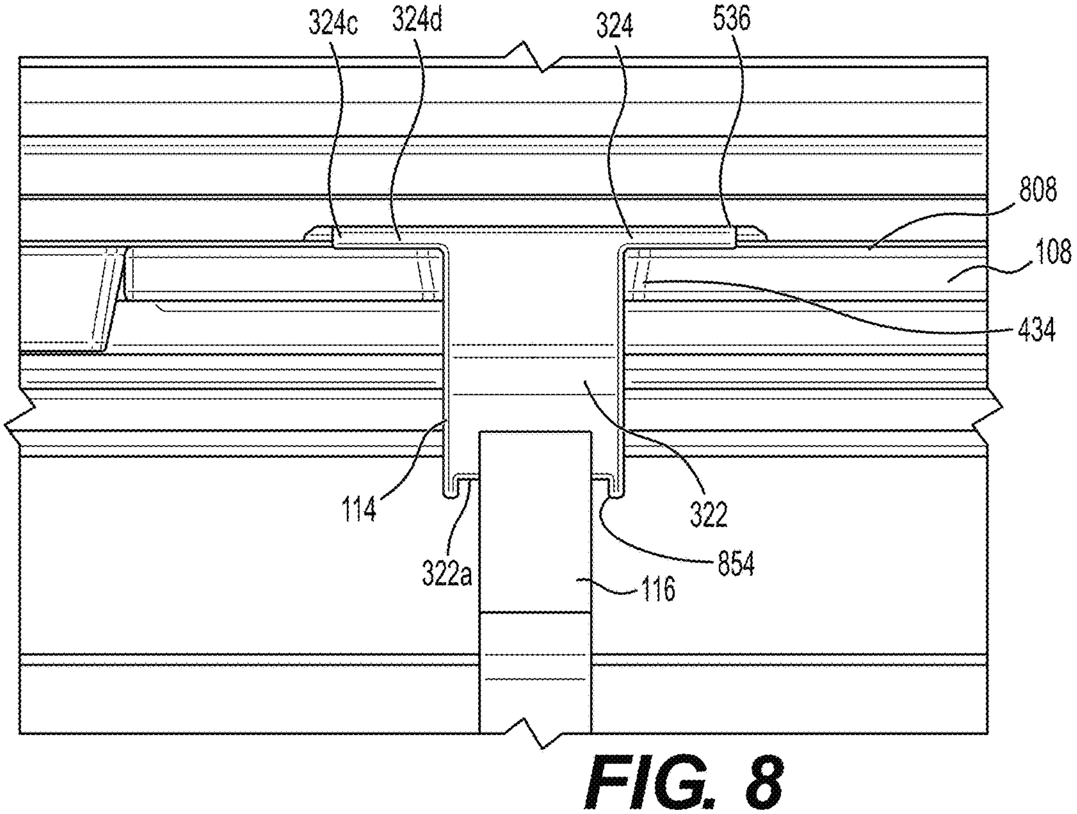
FIG. 8 is an elevation view of the portion shown in FIG. 6.

In some embodiments, and as shown in FIG. 3, each grounding plate 114 may include a base 322 having a lower end **322*a* and an upper end 322*b*, an intermediate member 324 extending from the upper end 322*b* substantially horizontally from a first end 324*a* to a second end 324*b* of the intermediate member 324, and the contact 320 extending upward from the second end 324*b* of the intermediate member 324 above the upper end 322*b* of the base 322. In some embodiments, and as shown in FIG. 3, the intermediate member 324 may be substantially planar and have a substantially constant thickness between the first end 324*a* and the second end 324*b*. In some embodiments, and as shown in FIG. 3, the intermediate member 324 may have a width W between sides 324*c* that is tapered radially inwardly toward the second end 324*b*. In some embodiments, and as shown in FIG. 3, the intermediate member 324 may include tabs 324***d* extending from the sides 324*c* and configured to rest on an upper surface 808 of the fixed deposition ring 108, as shown most clearly in FIG. 8. In some embodiments, and as shown in FIGS. 6 and 8, the lower end 322*a* of the base 322 may be configured to seat on a corresponding lift pin 116.

As discussed above, in some embodiments, the grounding plates 114 are electrically conductive and may be made wholly or partially of metal. More specifically, in some embodiments, the grounding plates 114 are configured to conduct electricity from the contact 320 to the lower end 322*a* of the base 322 so that when the lower end 322*a* of the base 322 contacts a lift pin 116, a conductive path will extend from the contact 320 to the lift pin 116.

In some embodiments, and as shown in FIGS. 3 and 6, the contact 320 may have a contact surface 320*a* configured to engage an underside 606 of a substrate 106. The contact surface 320*a* may take various forms. For example, in some embodiments, and as shown in FIG. 3, the contact surface 320*a* may be planar and may have an oval shape. In some embodiments, the contact surface 320*a* may have other shapes, such as circular or polygonal. Also, in some embodiments, the contact surface may be curved, such as hemispherical.

Figure 4:
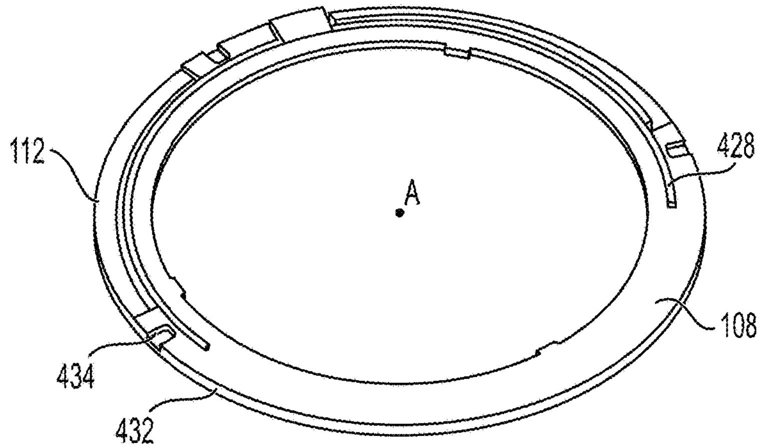
FIG. 4 is an isometric view (viewed from an underside) of a fixed deposition ring and a moving deposition ring of a substrate handling system in accordance with at least one embodiment of the present disclosure.
Figure 5:
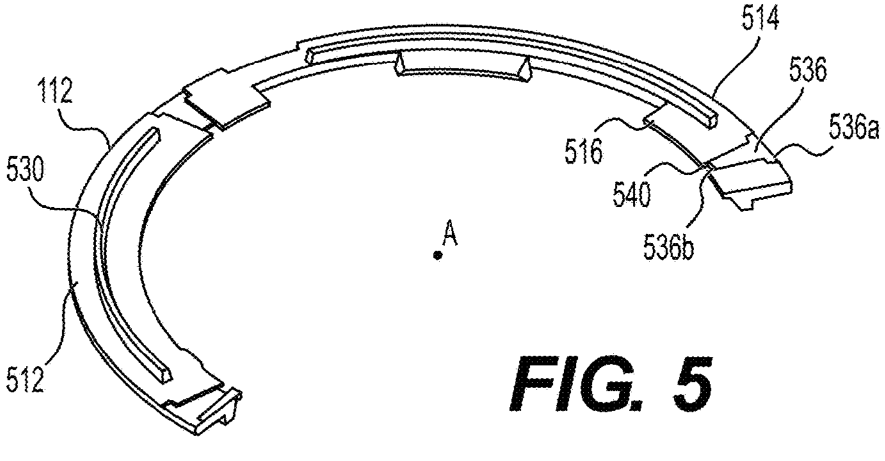
FIG. 5 is an isometric view of the moving deposition ring shown in FIG. 4 with the fixed ring removed for clarity of illustration.

In some embodiments, and as shown in FIGS. 4 and 5, the fixed deposition ring 108 and the moving deposition ring 112 may have one or more alignment features such as for vertical, axial, and/or radial alignment between the fixed deposition ring 108, the moving deposition ring 112, and the grounding plates 114. For example, in some embodiments, and as shown in FIGS. 4 and 5, the fixed deposition ring 108 may include an arcuate rib 428 and the moving deposition ring 112 may include a plurality of arcuate ribs 530 that are configured to be seated adjacent the arcuate rib 428 to facilitate axial and radial alignment of the moving deposition ring 112 with the fixed deposition ring 108 along central axis A. Also, in some embodiments, and as shown in FIG. 4, the fixed deposition ring 108 may have an outer edge 432 that includes a plurality of radially extending notches 434 that are circumferentially spaced from one another. In some embodiments, each notch 434 may be sized and configured to receive a base 322 of a corresponding one of the grounding plates 114, as discussed in greater detail below.

Figure 7:
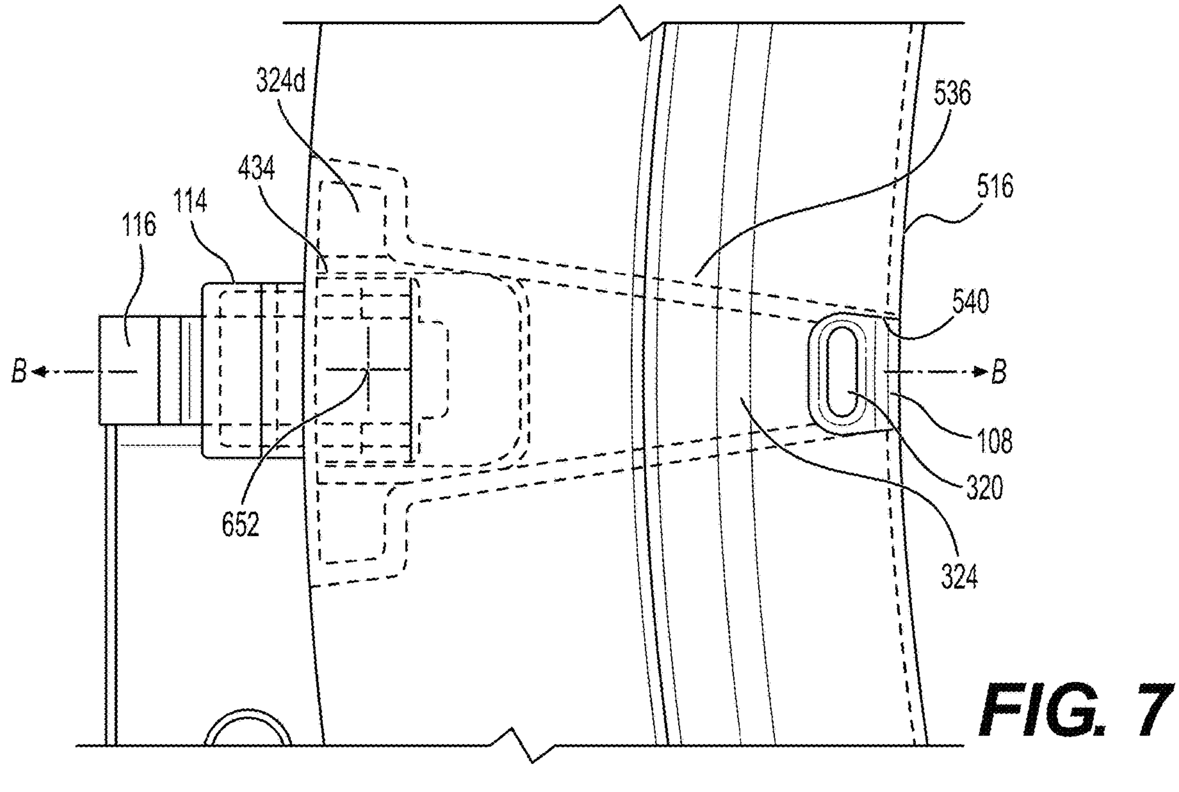
FIG. 7 is a plan view of the portion shown in FIG. 6.

In some embodiments, and as shown in FIG. 5, the moving deposition ring 112 may have a generally arcuate shape. Also, in some embodiments, and as shown in FIG. 5, the moving deposition ring 112 may include a plurality of circumferentially spaced recesses 536 that extend radially from an outer end 536*a* to an inner end 536*b* along an underside 512 of the moving deposition ring 112. In some embodiments, and as shown in FIG. 5, each recess 536 may be tapered radially inwardly. In some embodiments, and as shown in FIG. 8, each recess 536 may be configured to receive at least the intermediate member 324 of a corresponding grounding plate 114. In some embodiments, and as shown in Figure the outer end 536*a* of the recess 536 may extend to an outer edge 514 of the moving deposition ring 112 and the inner end 536*b* of the recess 536 may be spaced from an inner edge 516 of the moving deposition ring 112 by a notch 540 formed in the inner edge 516 that is configured to receive the contact 320 of one of the grounding plates 114, as discussed in greater detail below, and as shown most clearly in FIGS. 6 and 7. In some embodiments, and as shown in FIG. 7, each notch 540 is radially aligned with a corresponding recess 536. In some embodiments, and as shown in FIG. 7, each recess 536 of the moving deposition ring 112 may be configured to radially align with a corresponding notch 434 of the fixed deposition ring 108. Thus, in some embodiments, and as shown in FIG. 7, each recess 536 and/or notch 540 of the moving deposition ring 112 may be configured to radially align (along center line B-B) with a corresponding notch 434 of the fixed deposition ring 108.

In some embodiments, and as shown in FIG. 6, the fixed deposition ring 108 may seat on the annular surface 210 of the substrate support 102 surrounding the substrate support surface 104. Also, in some embodiments, and as shown in FIG. 6, the intermediate member 324 of the grounding plate 114 may seat on the fixed deposition ring 108, and the moving deposition ring 112 may seat over the grounding plate 114 with the intermediate member 324 of the grounding plate 114 received in the recess 536 of the moving deposition ring 112. In some embodiments, and as shown in FIGS. 6 and 8, the moving deposition ring 112 may seat on at least one of plurality of grounding plates 114 or the fixed deposition ring 108 along areas surrounding the sides 324*c* of the grounding plates 114. Also, in some embodiments, and as shown in FIGS. 6 and 7, when the grounding plate 114 is received in the recess 536, the contact 320 may extend upward in the notch 540 formed in the moving deposition ring 112 in a space adjacent the substrate support surface 104. In some embodiments, and as shown in FIG. 6, the contact surface 320*a* may extend slightly (e.g., about 0.1 mm to 0.2 mm) above the substrate support surface 104 so that the contact surface 320*a* engages the underside 606 of the substrate 106, if present on the substrates support surface 104. Also, in some embodiments, and as shown in FIG. 6, the contact 320 may be spaced radially from the substrate support surface 104 by the inner edge 516 of the moving deposition ring 112.

In some embodiments, and as shown in FIG. 6, each lift pin 116 may have a support surface 650 that extends radially between an outer end 650*a* and an inner end 650*b*. Each grounding plate 114 has a center of gravity 652 located over the support surface 650 of the lift pin 116. In some embodiments, and as shown in FIG. 7, the center of gravity 652 of the grounding plate 114 is located along a centerline B-B between the tabs 324*d*. Also, in some embodiments, and as shown in FIG. 8, the lower end 322*a* of the base 322 may have a notch 854 to receive the support surface 650 of the lift pin 116.

In some embodiments, and as shown in FIG. 8, the width of each recess 536 may be slightly larger than the width W of the intermediate member 324 of the grounding plate 114. For example, a clearance between sides 324*c* of the intermediate member 324 and sides of the recess 536 may be about 0.5 mm. Such clearance may be provided to allow for thermal expansion of the grounding plate 114 in the recess 536.

In some embodiments, and as shown in FIG. 8, the notches 434 of the fixed deposition ring 108 may be vertically tapered (e.g., have vertically tapered sidewalls) to facilitate alignment of the bases 322 of the grounding plates 114 in the notches 434. Also, in some embodiments, and as shown in FIG. 8, a clearance may be provided between each notch 434 and the sides of the base 322 of the grounding plate 114. In some embodiments, the clearance may be at least about 0.5 mm. Also, in some embodiments, and as shown in FIG. 8, tabs 324*d* may be seated on the upper surface 808 of the fixed deposition ring 108 on opposite sides of the notch 434.

Figure 9:
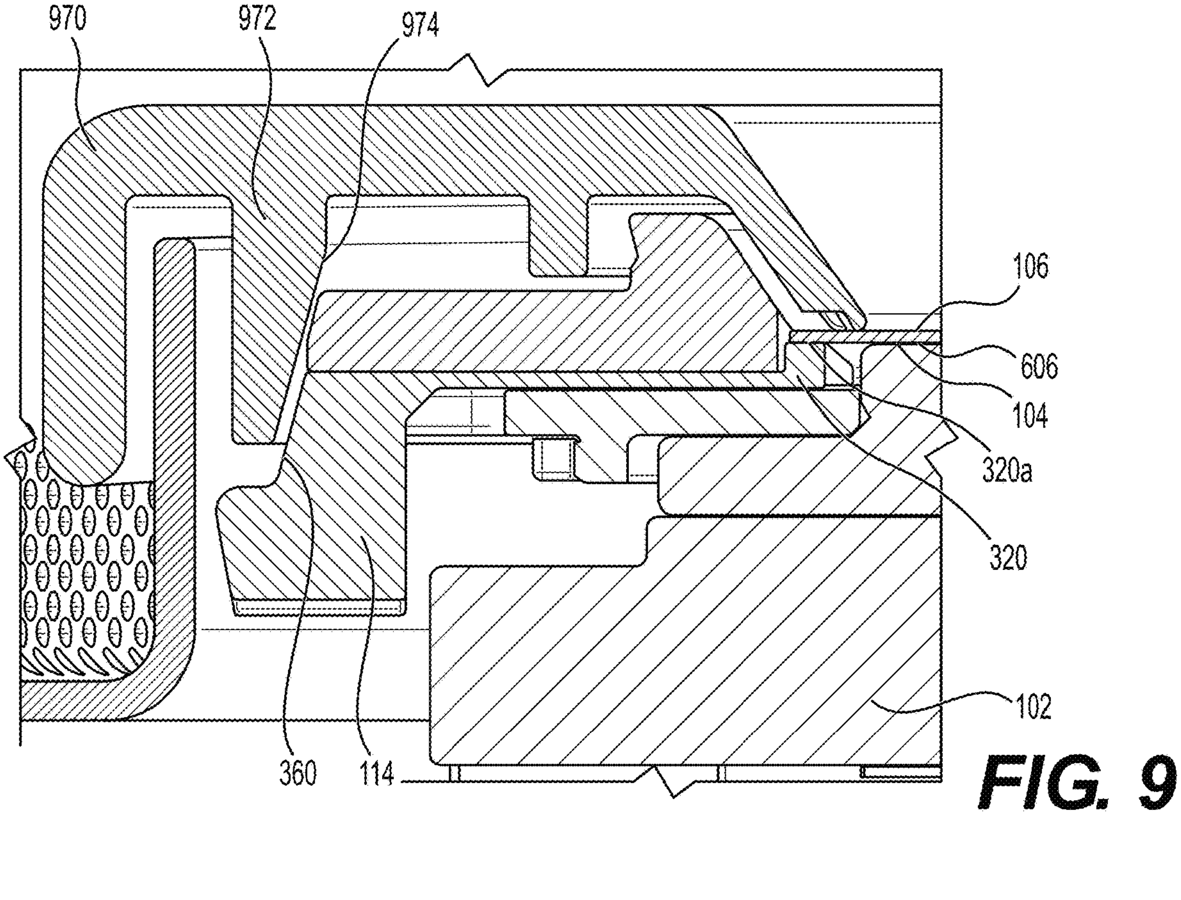
FIG. 9 is a partial section view of a substrate handling system configured in a processing position in accordance with at least one embodiment of the present disclosure.

In some embodiments, and as shown in FIGS. 3 and 9, the grounding plate 114 may have an outer angled surface 360 that is configured to extend substantially parallel to a surface 974 of a protrusion 972 of a cover plate 970 when the substrate handling system 100 is in the processing position shown in FIG. 9. The parallel angled surfaces 974 and 360 may be configured to facilitate radial alignment and centering of the cover plate 970 with respect to the moving deposition ring 112 and the fixed deposition ring 108.

Figure 10:
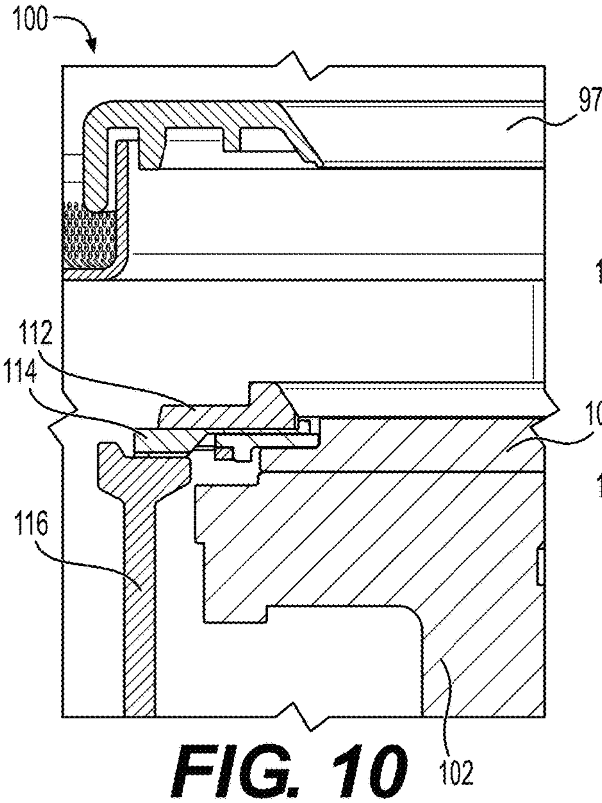
FIG. 10 shows a substrate handling system with a substrate support and lift pins in a first relative position in accordance with at least one embodiment of the present disclosure.
Figure 11:
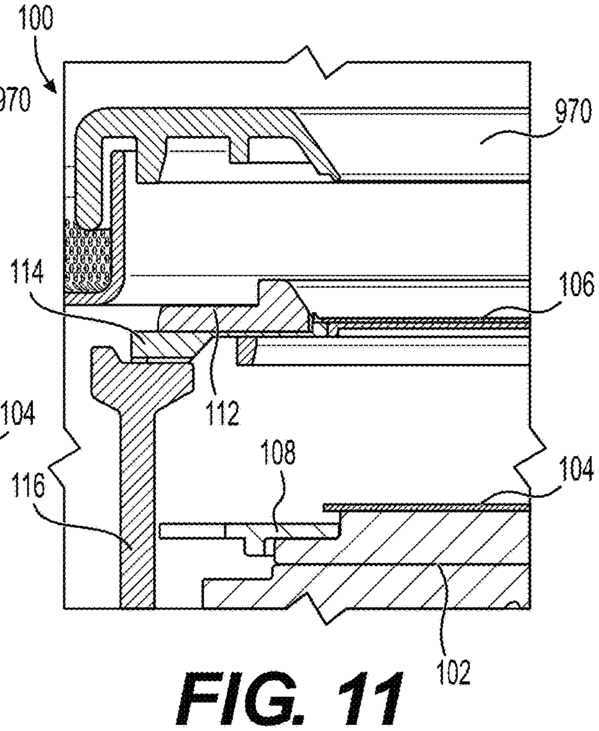
FIG. 11 shows the substrate handling system of FIG. 10 with the substrate support and the lift pins in a second relative position.
Figure 12:
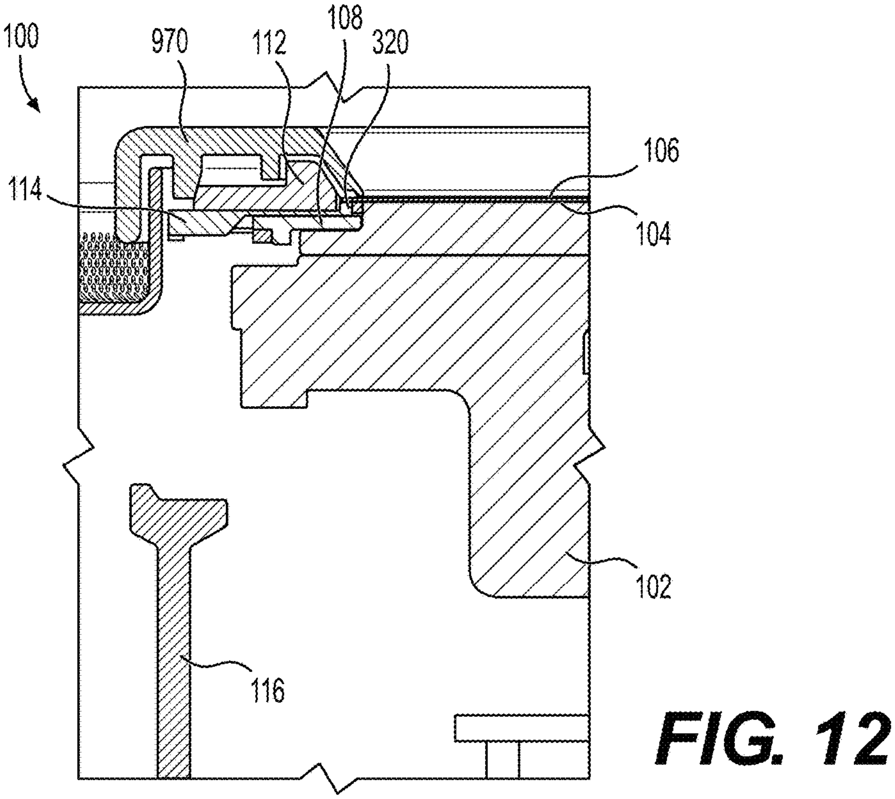
FIG. 12 shows the substrate handling system of FIG. 10 with the substrate support and the lift pins in a third relative position.

In some embodiments, and as shown in FIGS. 10-12, the substrate handling system 100 may be reconfigured by altering the relative position of at least one of the lift pins 116 or the substrate support 102. In some embodiments, and as shown in FIGS. 10 and 12, the substrate handling system 100 may be in a first configuration in which the lift pins 116 are not in electrical contact with the grounding plates 114, while in FIG. 11, the substrate handling system 100 may be in a second configuration in which the lift pins 116 are in electrical contact with the grounding plates 114. In FIGS. 10 and 12, the grounding plates 114, the fixed deposition ring 108, and the moving deposition ring 112 are all supported solely by the substrate support 102, while in FIG. 11 the grounding plates 114 and the moving deposition ring 112 are supported by the lift pins 116. FIG. 10 represents a home position of the substrate support 102 and the lift pins 116, which are slightly spaced below the grounding plates 114. From the arrangement shown in FIG. 10 to that of FIG. 11, the lift pins 116 may be raised and the substrate support 102 may be lowered thereby causing the lift pins 116 to contact and lift the grounding plates 114, which, in turn, can lift the moving deposition ring 112 vertically away from the fixed deposition ring 108 to a transfer position. In the transfer position shown in FIG. 11, a substrate 106 may be loaded onto or off the moving deposition ring 112. From the arrangement shown in FIG. 11 to that of FIG. 12, the substrate support 102 may be raised and the lift pins 116 lowered to a processing position where the substrate support 102 supports the substrate 106 as well as the fixed deposition ring 108, the moving deposition ring 112, and the grounding plates 114. Substrate processing may take place in the processing position.

Figure 13:
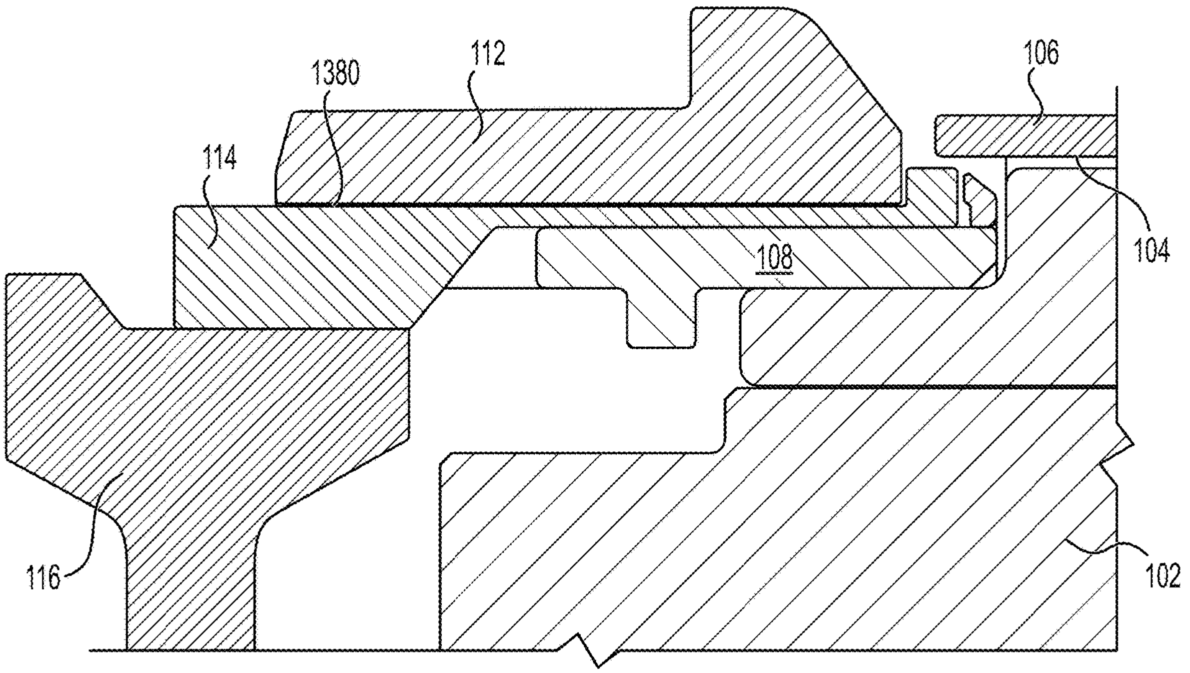
FIG. 13 shows an alternative substrate handling system to that shown in FIG. 6 in accordance with at least one embodiment of the present disclosure.

In some embodiments, and as shown in FIG. 9, the contact 320 of the grounding plate may be configured to engage the underside 606 of the substrate 106 in the processing position. However, for some processes occurring in a process chamber, electrical contact with the substrate 106 during processing is not desirable. Thus, in some embodiments, the substrate handling system 100 may be configured so that the contact 320 of the grounding plate 114 is not in contact with the substrate 106 in the processing position. For example, FIG. 13 shows a modification of the portion of the substrate handling system 100 shown in FIG. 6 where the moving deposition ring 112 is configured to seat on the fixed deposition ring 108 in spaced relation to the grounding plates 114. In the embodiment shown in FIG. 12, the moving deposition ring 112 is seated on the fixed deposition ring 108, rather than the grounding plates 114 in the processing position so that a clearance 1380 is created between the grounding plates 114 and the moving deposition ring 112. In some embodiments, the clearance 1380 may be about 0.2 mm. As a result of the clearance 1380, the contact 320 may be spaced vertically below the substrate support surface 104 to contact the substrate 106 when the lift pins 116 engage the grounding plates 114 and then raise the grounding plates 114 at least through the clearance 1380.

Figure 14A:
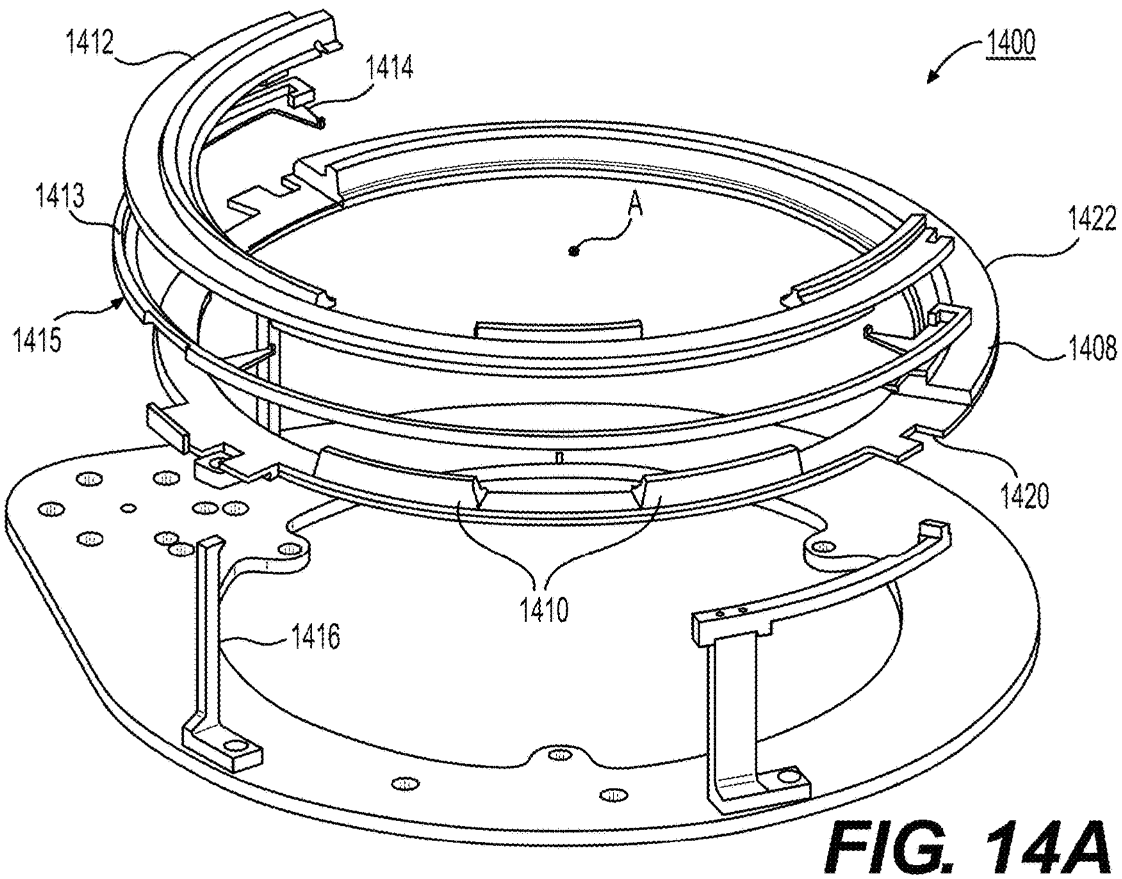
FIG. 14A shows an isometric assembly view of a substrate handling system in accordance with at least one embodiment of the present disclosure.
Figure 14B:
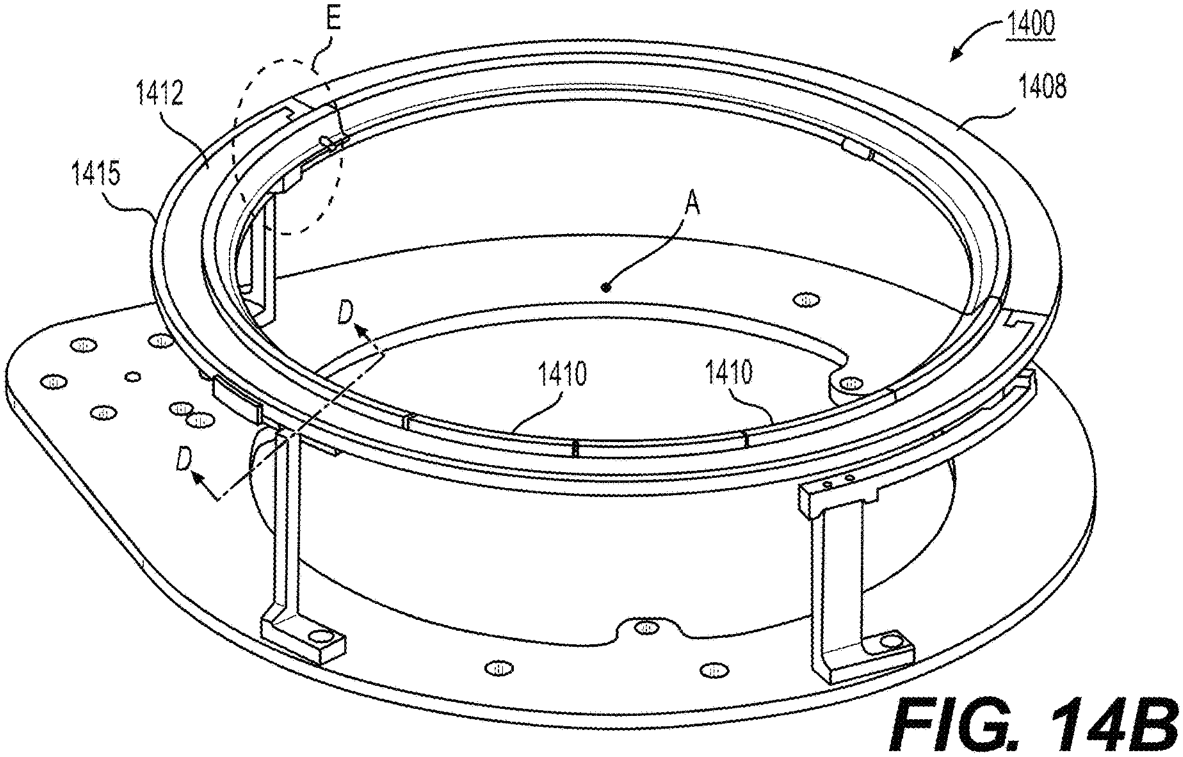
FIG. 14B shows the substrate handling system of FIG. 14A assembled and configured in the home position.

FIGS. 14A and 14B show an isometric view of substrate handling system 1400 in accordance with at least one embodiment of the present disclosure. In some embodiments, the substrate handling system 1400 includes lift pins 1416, a moving deposition ring 1412, a fixed deposition ring 1408, and a grounding element 1415 (hereinafter referred to as a "grounding ring") including a plurality of grounding plates 1414 joined together by at least one arcuate member 1413. The grounding plates 1414 serve the same function as the grounding plates 114 described herein, i.e., to create an electrically conductive path between a substrate (e.g., substrate 106) on a substrate support surface (e.g., substrate support surface 104) and the lift pins 1416. In some embodiments, the grounding plates 1414 and the arcuate members 1413 are formed of an electrically conductive material, such as stainless steel In some embodiments, the grounding ring 1415 and the moving deposition ring 1412 are configured to move with respect to the fixed deposition ring 1408. Also, in at least one configuration, and as shown in FIG. 14B, the moving deposition ring 1412 and the grounding ring 1415 are configured to seat on the fixed deposition ring 1408 forming an annular assembly around central axis A to support a substrate, such as substrate 106, around an outer edge of the substrate. In some embodiments, and as described in further detail below, the moving deposition ring 1412 and the grounding ring 1415 are configured to be connected to limit relative movement between the moving deposition ring 1412 and the grounding ring 1415.

In some embodiments, and as shown in FIG. 14A, the fixed deposition ring may have a plurality of notches 1420 formed along an outer edge 1422 for allowing axial movement of the lift pins 1416 under the grounding plates 1414.

Figure 15:
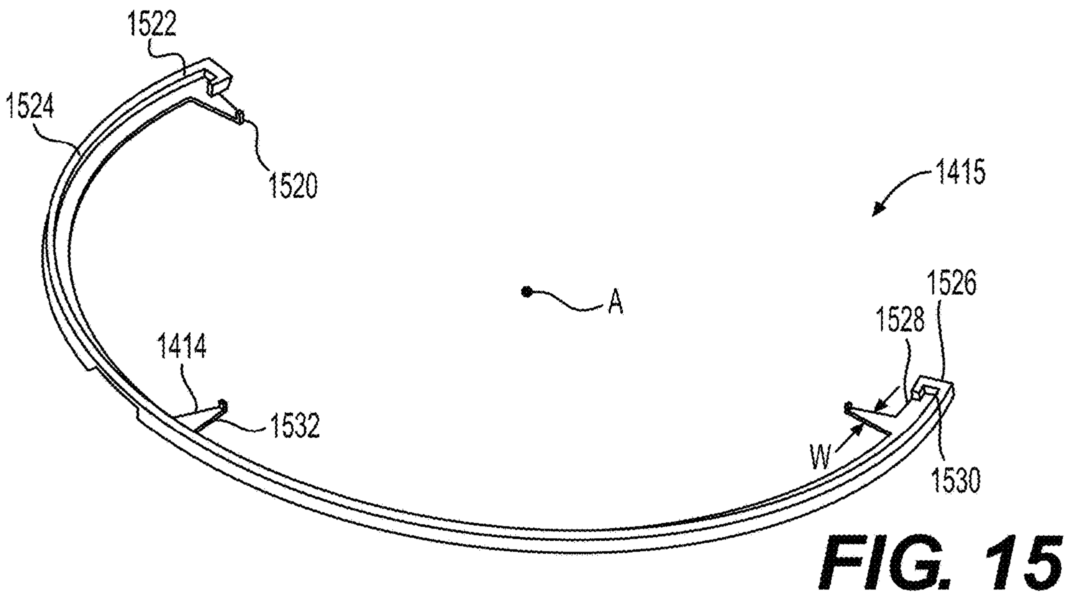
FIG. 15 shows an isometric view of a grounding ring of the substrate handling system shown in FIGS. 14A and 14B, viewed from a side and a top of the grounding ring.

In some embodiments, and as shown in FIG. 15, each grounding plate 1414 may have a base 1522 configured to contact a corresponding lift pin 1416. Also, each grounding plate 1414 may have a contact 1520 that is configured to extend adjacent to and contact an underside of a substrate (e.g., substrate 106), when the moving deposition ring 1412 and the grounding ring 1415 are seated on the fixed deposition ring 1408 as shown in FIG. 14B.

Figure 16:
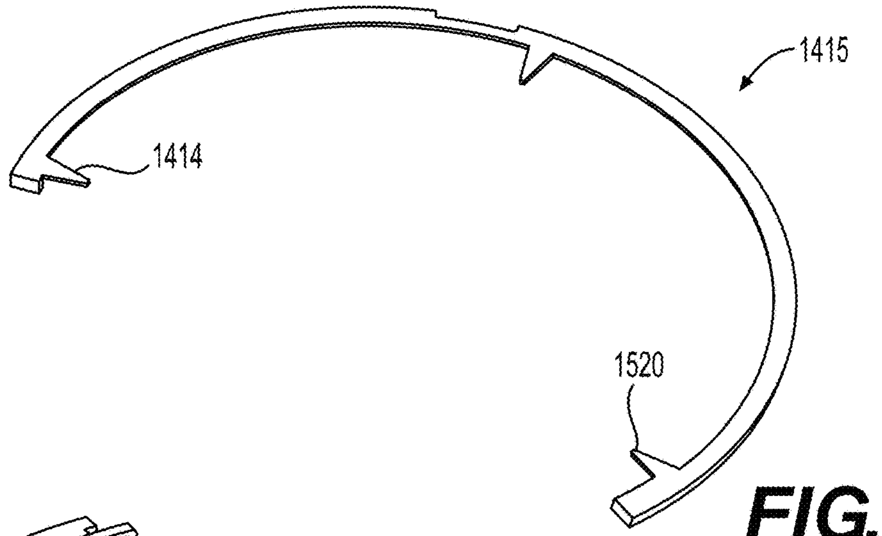
FIG. 16 shows an isometric view of the grounding ring of FIG. 15 viewed from a side and a bottom of the grounding ring.

Each grounding plate 1414 may have an intermediate member 1532 spacing the base 1522 from the contact 1520. In some embodiments, and as shown in FIGS. 15 and 16, the base 1522 and the intermediate member may have generally flat upper and lower surfaces and may be coplanar. In some embodiments, and as shown in FIG. 15, each grounding plate 1414 may extend radially inwardly (with respect to central axis A) from the base 1522 to the contact 1520. In some embodiments, and as shown in FIG. 15, each grounding plate 1414 may have a width W that tapers in the radial direction from the base 1522 to the contact 1520.

In some embodiments, and as shown in FIG. 15, the grounding ring 1415 may have a raised outer edge 1524. Also, in some embodiments, and as shown in FIG. 15, the raised outer edge 1524 may also extend radially inwardly along ends 1526 of the grounding ring 1415 and wrap around along an inner edge 1528 of the grounding ring 1415 creating a notch 1530 at each end 1526.

Figure 17:
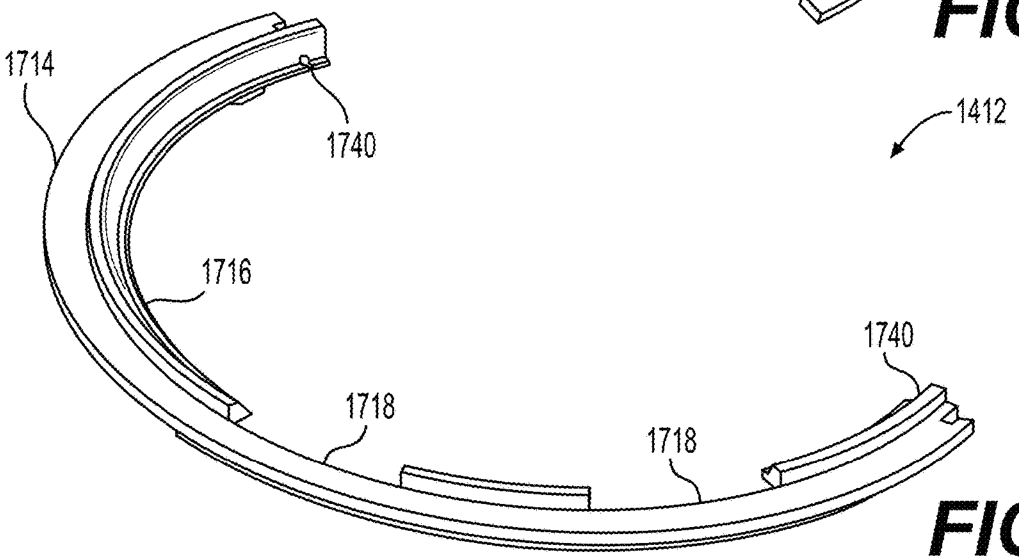
FIG. 17 shows an isometric view of a moving deposition ring of the substrate handling system shown in FIGS. 14A and 14B.

In some embodiments, and as shown in FIG. 17, the moving deposition ring 1412 may have a generally arcuate shape and may have an inner edge 1716 and an outer edge 1714. The inner edge 1716 may have spaces 1718 configured to align with and receive portions 1410 of the fixed deposition ring 1408 shown in FIG. 14B. Also, in some embodiments, and as shown in FIG. 17, the moving deposition ring 1412 may include a plurality of circumferentially spaced notches 1740 along the inner edge 1716. The notches 1740 may be configured to receive corresponding contacts 1520 of the grounding plates 1414 when the moving deposition ring 1412 is seated on the grounding ring 1415, as shown more clearly in FIGS. 18-20. In some embodiments, an underside of the moving deposition ring 1412 may include a plurality of circumferentially spaced recesses like recesses 536 described above to receive corresponding ones of the grounding plates 1414.

Figure 18:
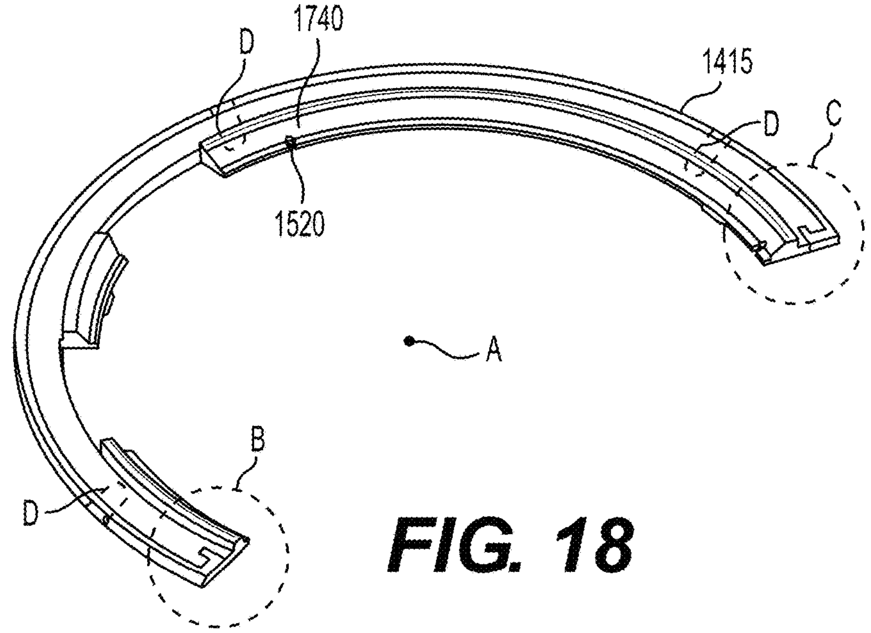
FIG. 18 shows an isometric view of the moving deposition ring of FIG. 17 seated on the grounding ring of FIGS. 15 and 16.
Figure 19:
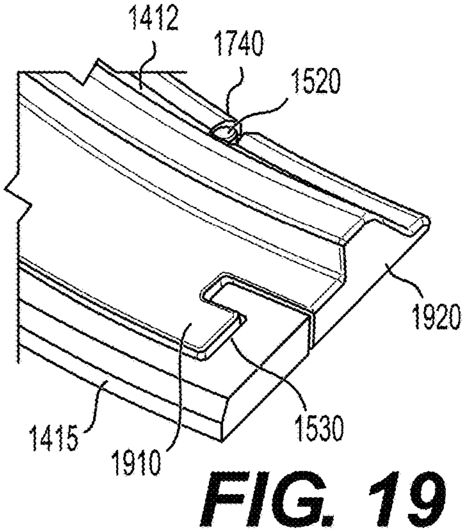
FIG. 19 is an enlarged isometric view of the portion labeled "B" in FIG. 18.
Figure 20:
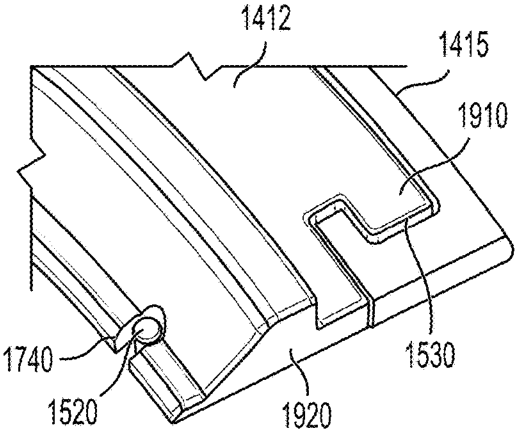
FIG. 20 is an enlarged isometric view of the portion labeled "C" in FIG. 18.

Also, in some embodiments, and as shown in greater detail in FIGS. 18-20, when the moving deposition ring 1412 is seated on the grounding ring 1415, the outer edge 1714 may extend along (e.g., closely spaced or in contact with) the raised outer edge 1524 of the grounding ring 1415. In some embodiments, and as shown most clearly in FIGS. 19-20, the moving deposition ring 1412 may have a tab 1910 formed at each end 1920 of the of the moving deposition ring 1412. In some embodiments, and as shown in FIGS. 19 and 20, each tab 1910 may be received in a corresponding notch 1530 formed in the ends 1526 of the grounding ring 1415. In some embodiments, the tabs 1910 and notches 1530 may be configured to fit together or interconnect using, for example, a "tongue and groove" arrangement (as shown in FIGS. 19 and 20) or a "dovetail" arrangement. The tabs 1910 and notches 1530 are configured to limit relative rotation about central axis A between the moving deposition ring 1412 and the grounding ring 1415.

Figure 21:
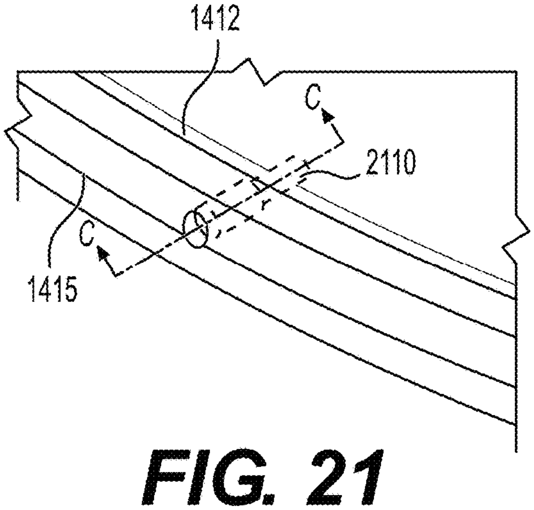
FIG. 21 is a detailed view of the portion labeled "D" shown in FIG. 18.
Figure 22:
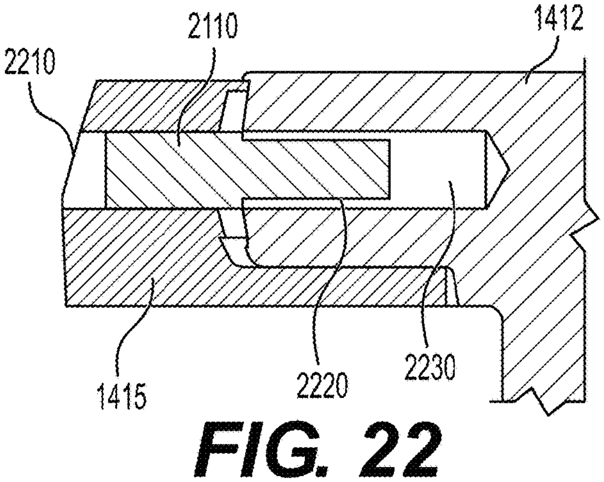
FIG. 22 is a section view along section C-C in FIG. 21.

In some embodiments, and as shown in FIGS. 21 and 22, the moving deposition ring 1412 and the grounding ring 1415 may be coupled together by circumferentially spaced pins 2110 extending radially between the moving deposition ring 1412 and the grounding ring 1415. The pins 2110 may limit relative axial and rotational movement between the moving deposition ring 1412 and the grounding ring 1415. In some embodiments, and a shown in FIG. 22, the grounding ring 1415 may have a plurality of radially extending through holes 2210 and the moving deposition ring may have a plurality of holes 2220 aligned with the through holes 2210 for receiving the pins 2110. A space 2230 may be provided between the pin 2110 and the hole 2220 to allow clearance due to thermal expansion of the pin 2110 and/or the grounding ring 1415 during substrate processing.

Figure 23:
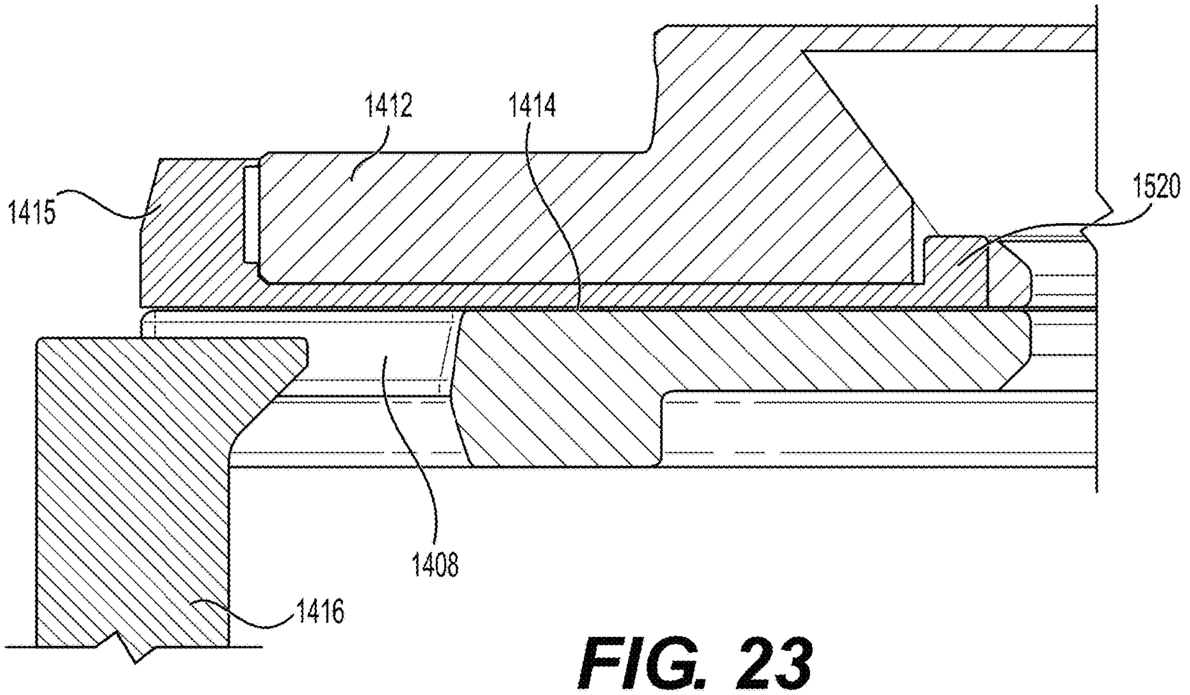
FIG. 23 is a view of the substrate handling system shown in FIG. 14B along section D-D.
Figure 24:
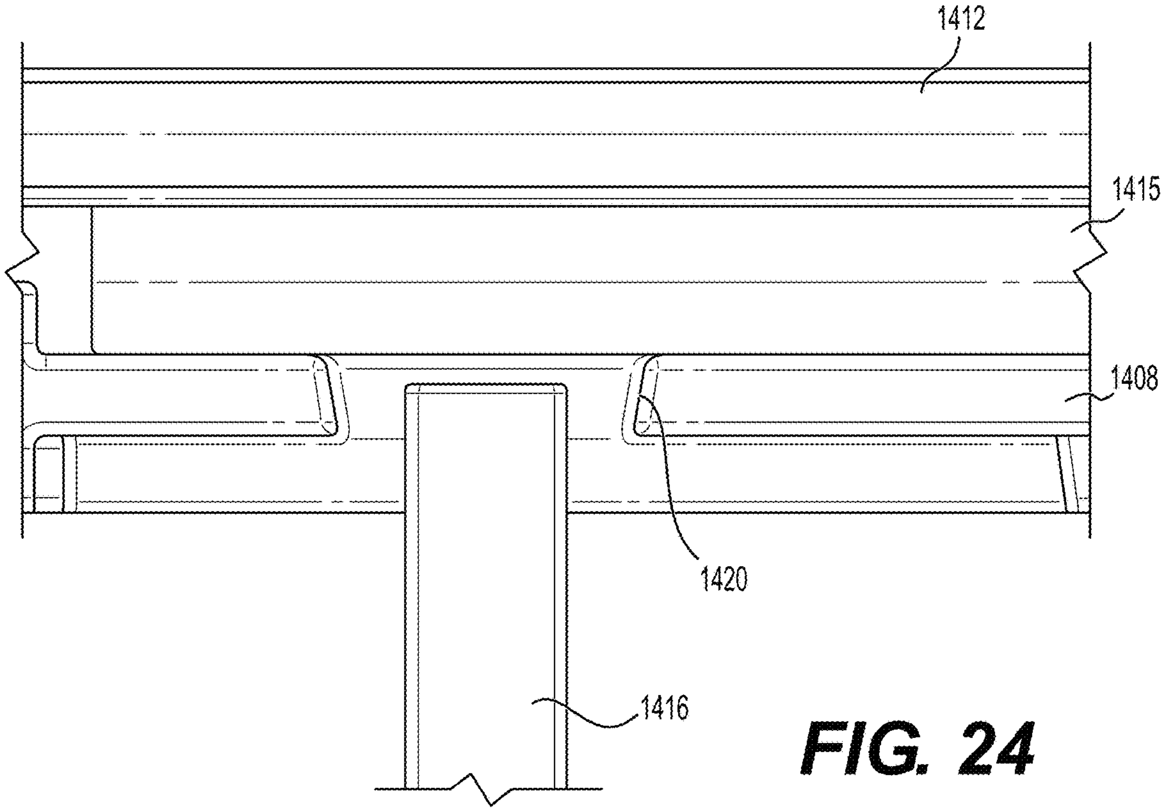
FIG. 24 is an enlarged elevation view of the portion labeled "E" of the substrate handling system shown in FIG. 14B.

FIGS. 23 and 24 show relative positions between the lift pins 1416 and the grounding plates 1414 in the home position, as described herein. In the home position shown in FIGS. 23 and 24, the lift pins 1416 are spaced below the grounding plates 1414 such that no electrical connection is made between the lift pins 1416 and the grounding plates 1414. Thus, in the home position, any substrate (e.g., substrate 106) in contact with the contact 1520 is not grounded by the lift pins 1416. From the process position shown in FIGS. 23 and 24, the lift pins 1416 can be raised and/or the grounding plates 1414 can be lowered by lowering the grounding ring 1415 until the lift pins 1416 contact the grounding plates 1414 in a transfer position, thereby making an electrical connection between the lift pins 1416 and the grounding plates 1414. In the transfer position, electrical charge on a substrate (e.g., substrate 106) in contact with the contacts 1520 can be discharged through the grounding ring 1415 and the lift pins 1416.

Thus, systems, methods, and apparatus have been described for handling substrates that permit substrates to be grounded while being handled. Such systems, methods, and apparatus may be useful for handling thin substrates which are often handled along their edges.

While the foregoing is directed to embodiments of the present disclosure, other and further embodiments of the disclosure may be devised without departing from the basic scope thereof.

The invention claimed is:

1. A substrate handling system comprising:
a fixed deposition ring;
a moving deposition ring disposed above the fixed deposition ring and configured for vertical movement, the moving deposition ring being electrically non-conductive; and
a plurality of circumferentially spaced, electrically conductive grounding plates vertically disposed between the fixed deposition ring and the moving deposition ring, each grounding plate extending from a radially inner end to a radially outer end, each grounding plate configured for vertical movement relative to the fixed deposition ring, and each grounding plate having an electrical contact at the radially inner end.

2. The substrate handling system according to claim 1, further comprising:
a substrate support having a substrate support surface configured to support a substrate, wherein the fixed deposition ring is seated on the substrate support around the substrate support surface; and
a plurality of circumferentially spaced, electrically conductive lift pins arranged around the substrate support and under the radially outer ends of the grounding plates, the lift pins configured for vertical movement relative to the substrate support,
wherein each lift pin has a support surface extending radially between a first end and a second end, and wherein each grounding plate has a center of gravity located directly above the support surface, and
wherein the substrate handling system is configurable between a first configuration wherein the lift pins are spaced vertically from the radially outer ends of the grounding plates and a second configuration wherein the lift pins are in contact with the radially outer ends of the grounding plates, wherein in the second configuration an electrically conductive path is formed through the grounding plates and the lift pins.

3. The substrate handling system according to claim 2, wherein in the second configuration the grounding plates are spaced from the fixed deposition ring.

4. The substrate handling system according to claim 2, wherein the grounding plates are joined together by arcuate members into a grounding ring.

5. The substrate handling system according to claim 2, wherein in the first configuration, the moving deposition ring is seated on the grounding plates and the grounding plates are seated on the fixed deposition ring.

6. The substrate handling system according to claim 2, wherein the moving deposition ring includes a plurality of circumferentially spaced recesses formed on a lower surface of the moving deposition ring facing the grounding plates, wherein each recess is configured to receive a first portion of one grounding plate in the first configuration.

7. The substrate handling system according to claim 1, wherein the fixed deposition ring includes a plurality circumferentially spaced notches formed along an outer edge of the fixed deposition ring, wherein each notch is configured to radially align with a corresponding grounding plate, and wherein each notch is configured to receive a portion of a corresponding lift pin.

8. The substrate handling system according to claim 7, wherein each notch of the fixed deposition ring is vertically tapered.

9. The substrate handling system according to claim 1, wherein the moving deposition ring has an inner edge including a plurality of circumferentially spaced notches, wherein each notch is configured to receive a corresponding contact.

10. The substrate handling system of claim 1, wherein the fixed deposition ring has a plurality of circumferentially spaced notches along an outer edge of the fixed deposition ring, the fixed deposition ring being electrically non-conductive;

the moving deposition ring having an inner edge and a plurality of circumferentially spaced notches formed along the inner edge of the moving deposition ring, the notches configured to radially align with the notches of the fixed deposition ring; and each grounding plate having a base, an intermediate member, and a contact extending from the intermediate member and being spaced from the base, each contact configured to be received in a corresponding notch formed in the inner edge of the moving deposition ring.

11. The substrate handling system according to claim 10, wherein the intermediate member of each grounding plate is tapered radially inwardly.

12. The substrate handling system according to claim 10, wherein the notches of the fixed deposition ring are vertically tapered between an upper surface of the fixed deposition ring and a lower surface of the fixed deposition ring.

13. The substrate handling system according to claim 10, further comprising at least one arcuate member joining the plurality of grounding plates into a grounding ring.

14. The substrate handling system according to claim 13, wherein the moving deposition ring is connected to the grounding ring to limit relative movement between the moving deposition ring and the grounding ring.

15. The substrate handling system according to claim 14, further comprising at least one pin extending between the moving deposition ring and the grounding ring.

16. The substrate handling system according to claim 14, wherein the moving deposition ring and the grounding ring are configured to interconnect.

* * * * *